United States Patent [19]

Petersen et al.

[11] Patent Number: 5,956,106
[45] Date of Patent: *Sep. 21, 1999

[54] ILLUMINATED DISPLAY WITH LIGHT SOURCE DESTRUCTURING AND SHAPING DEVICE

[75] Inventors: Joel Petersen, Valley Village; Jeremy Lerner, Culver City, both of Calif.

[73] Assignee: Physical Optics Corporation, Torrance, Calif.

[ * ] Notice: This patent is subject to a terminal disclaimer.

[21] Appl. No.: 08/595,307

[22] Filed: Feb. 1, 1996

Related U.S. Application Data

[62] Division of application No. 08/393,050, Feb. 23, 1995, Pat. No. 5,534,386, which is a continuation of application No. 08/097,953, Jul. 27, 1993, abandoned.

[51] Int. Cl.$^6$ .......................... G02F 1/1335; G02H 1/20; G02B 5/32
[52] U.S. Cl. .......................... 349/64; 349/187; 349/112; 359/599; 359/15; 359/12; 362/355; 362/800
[58] Field of Search .................. 349/187, 112, 349/64; 359/599, 12, 22, 15, 25; 430/321, 1, 2, 290; 362/355, 800; 264/1.31, 1.19, 2.5

[56] References Cited

U.S. PATENT DOCUMENTS

| | | | |
|---|---|---|---|
| 3,567,444 | 3/1971 | Shankoff | ................. 96/27 |
| 3,619,021 | 11/1971 | Biedermann et al. | ........... 350/3.5 |
| 3,698,810 | 10/1972 | Bestenreiner et al. | ........... 355/71 |

(List continued on next page.)

FOREIGN PATENT DOCUMENTS

| | | |
|---|---|---|
| 479490 | 4/1992 | European Pat. Off. . |
| 53-51755 | of 0000 | Japan . |
| 53-042726 | 4/1978 | Japan . |
| 53-42726 | 4/1978 | Japan . |
| 61-86221 | 5/1986 | Japan ................. 264/2.5 |
| 62-12939 | 1/1987 | Japan . |
| 62-12939 | 6/1987 | Japan . |

OTHER PUBLICATIONS

Blazed Holographic Gratings — Formation by Surface Waves and Replication by Metal Electroforming, James J. Cowan, Polaroid Corporation, SPIE vol. 240 (1980), pp. 5–12.

High–Contrast High–Brightness Rear–Protection Display for High–Defination TV, Ando et al, Proceedings of the SID, vol. 26/4, 1985, pp. 315–321.

Holographic and Interferometric Viewing Screens, Dietrich Meyerhofer, Applied Optics, vol. 12, No. 9, Sep. 1973, pp. 2180–2184.

Dialog, JPO & Japio Database, Accession No. 00240726, (i.e., record including an English language abstract for JP 53042726 A), dated Jun. 17, 1978.

Cowan, J.J. "Blazed Holographic Gratings . . . " SPI vol. 240 Proc. Soc. Phto–opt Instrum. Eng. 1980, pp.5–12.

*Primary Examiner*—William L. Sikes
*Assistant Examiner*—Kenneth Parker
*Attorney, Agent, or Firm*—Nilles & Nilles, S.C.

[57] ABSTRACT

A light source destructuring and shaping device which both homogenizes and imparts predetermined directionality to light rays emanating from a light source is disclosed. The device comprises a micro-sculpted surface structure which controls the direction in which light propagates in either reflection or transmission. The sculpted surface structure also homogenizes light propagating through it with predetermined directionality. The device may be used in an almost unlimited number of applications which require homogenization and which would benefit from being able to impart directionality to light waves propagating from a light source. These applications include existing diffuser applications and applications wherein it was not practical to use conventional diffusers. The homogenizing and shaping device achieves these benefits with very high transmission or reflection efficiency and with reduced side lobes.

25 Claims, 10 Drawing Sheets

U.S. PATENT DOCUMENTS

| | | | |
|---|---|---|---|
| 3,708,217 | 1/1973 | McMahon | 350/3.5 |
| 3,909,111 | 9/1975 | Meyerhofer | 350/117 |
| 3,996,051 | 12/1976 | Meyerhofer | 96/27 |
| 4,006,965 | 2/1977 | Takada et al. | 350/117 |
| 4,040,717 | 8/1977 | Cinque et al. | 350/127 |
| 4,053,208 | 10/1977 | Kato et al. | 350/117 |
| 4,054,635 | 10/1977 | Schlesinger et al. | 264/219 |
| 4,106,859 | 8/1978 | Doriguzzi et al. | 350/338 |
| 4,206,969 | 6/1980 | Cobb et al. | 350/126 |
| 4,268,118 | 5/1981 | Palmquist et al. | 350/128 |
| 4,290,696 | 9/1981 | Mould et al. | 356/300 |
| 4,309,093 | 1/1982 | Kuwayama et al. | 354/59 |
| 4,336,978 | 6/1982 | Suzuki | 350/167 |
| 4,372,639 | 2/1983 | Johnson et al. | 350/3.7 |
| 4,427,265 | 1/1984 | Suzuki et al. | 350/321 |
| 4,428,648 | 1/1984 | Wiley | 350/238 |
| 4,481,414 | 11/1984 | Gasper | 250/226 |
| 4,523,807 | 6/1985 | Suzuki | 350/128 |
| 4,543,225 | 9/1985 | Beaujean | 264/167 |
| 4,545,646 | 10/1985 | Chern et al. | 350/162.2 |
| 4,558,922 | 12/1985 | Smith | 350/127 |
| 4,567,123 | 1/1986 | Ohtaka et al. | 430/4 |
| 4,888,201 | 12/1989 | Veenvliet et al. | 427/38 |
| 4,968,117 | 11/1990 | Chern et al. | 350/162.24 |
| 5,046,793 | 9/1991 | Hockley et al. | 359/12 |
| 5,048,925 | 9/1991 | Gerritsen et al. | 359/569 |
| 5,300,263 | 4/1994 | Hoopman et al. | 264/2.5 |
| 5,365,354 | 11/1994 | Jannson et al. | 359/15 |
| 5,521,030 | 5/1996 | McGrew | 430/1 |
| 5,534,386 | 7/1996 | Petersen et al. | 430/320 |
| 5,609,939 | 3/1997 | Petersen | 428/141 | ns. 5,956,106

ILLUMINATED DISPLAY WITH LIGHT SOURCE DESTRUCTURING AND SHAPING DEVICE

This application is a division, of application number 08/393,050, filed Feb. 23, 1995, now U.S. Pat. No. 5,534, 386 which is a continuation of application number 08/097, 953, filed Jul. 27, 1993 abandoned.

BACKGROUND OF THE INVENTION

1. Field of the Invention

This invention pertains to homogenization of light sources. More particularly, this invention pertains to a homogenizer which destructures and shapes light

2. Description of the Prior Art

Prior art diffusers or homogenizers scatter light in various directions, and the intensity in a particular direction depends on the diffuser structure. There are numerous types of conventional diffusers such as ground glass, opal glass, opaque plastics, chemically etched plastics, and machined plastics. Cloth and nylon diffusers are used as well. All of these prior art diffusers have shortcomings that make them unsuitable for many applications. Transmission efficiency is poor, and it is not possible to control the direction, or shape, of diffused light with most of these diffusers.

Lenticular, or machined plastic diffusers, can be made to control the angle of diffused light by varying the characteristics of the surface structures on the diffuser. In this sense, lenticular diffusers are more capable than most other conventional diffusers because, at least, the angle of diffused light can be partially controlled. Nonetheless, lenticular diffusers are undesirable in many applications because they are extremely complex macro-sized, two-sided structures. This makes them difficult and expensive to produce and not well adapted for very high resolution applications. Also, they generate significant side lobes which means that, even if the angle of diffused light can be controlled, much of the light energy is lost in the side lobes and is not transmitted through the desired aperture. Consequently, brightness suffers and higher intensity sources must be used to compensate for these losses.

SUMMARY OF THE INVENTION

A light source destructuring and shaping device is presented. More specifically, a device which both homogenizes and imparts predetermined directionality to light rays emanating from a light source is disclosed. The device of the present invention comprises a micro-sculpted surface structure which controls the direction in which light propagates in either reflection or transmission. The sculpted surface structure also homogenizes light propagating through it with predetermined directionality. The device may be used in an almost unlimited number of applications which require homogenization and which would benefit from being able to impart directionality to light waves emanating from a light source. These applications include existing diffuser applications and applications wherein it was not practical to use conventional diffusers. The homogenizing and shaping device of the present invention achieves these benefits with very high transmission or reflection efficiency and with reduced side lobes.

A method by which the device of the present invention is made comprises the steps of generating a surface structure in a photosensitive medium using coherent light, processing the medium, and replicating the surface structure in, for example, epoxy. The surface structure may be generated in the photosensitive medium by exposing it to coherent light which has been diffused. The light may be diffused by a ground glass, holographic, lenticular, or acetate diffuser, for example. The photosensitive medium may comprise, for example, dichromated gelatin, photoresist, silver halide, or photopolymer. Once the photosensitive medium is recorded and processed, any of a number of types of epoxy, or its equivalent, may be applied thereto to transfer the surface structure into the epoxy, which, when cured, may be separated from the medium. The cured epoxy layer may be used, as is, in a transmission application, or coated with a reflective material for a reflection application. For mass production, the epoxy layer may be subjected to electroform processes, or its equivalent, to create a metal master from which plastic, or other embossable materials, may be imprinted with the sculpted surface structure.

The surface structure of the device of the present invention controls directionality of light waves emanating from a light source in such a way that light may be directed into well defined fields of view. Furthermore, brightness or gain (number of photons per unit area) in this field of view is significantly increased because of the highly efficient surface structure of the device and because the light is not directed to areas where it is not desired. The applications of the device of the present invention are virtually unlimited.

DESCRIPTION OF THE PREFERRED EMBODIMENTS

Figure 1:
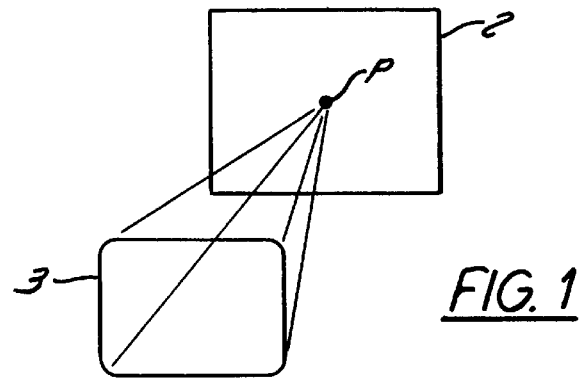
FIG. 1 is a schematic of a predefined output area of a homogenizer of the present invention.

Referring to FIG. 1, a homogenizer 2 of the present invention is shown having an exemplary predefined output area 3. Homogenizer 2 may comprise any number of embossable materials such as plastic containing a sculpted surface structure suitable for directing light incident thereon into a predefined output area 3. "Directed" light in this sense includes both light reflected from a reflective homogenizer and light transmitted through a transmissive homogenizer into a predefined output area. The homogenizer 2 may be any size or shape desired and would depend on the confines of the area in which it is to be used. A transmissive homogenizer of the present invention may simply comprise a sheet of plastic or other embossable translucent material which has been embossed with a sculpted surface structure suitable for transmitting light into the predefined output area 3 or a glass substrate with an epoxy replication layer on it As seen in FIG. 1, the exemplary predefined output area is a rectangle. Light is output within the predefined output area while only light at far reduced intensity levels exists outside the predefined output area 3. The surface structure in homogenizer 2 redirects light rays passing through the homogenizer 2 into the predefined output area 3 and does so highly efficiently. Light is actually redirected in the predefined output area so that light intensity within that area is higher than it would be without the homogenizer of the present invention. In other words, brightness is significantly increased in the predefined output area 3.

Figure 2A:
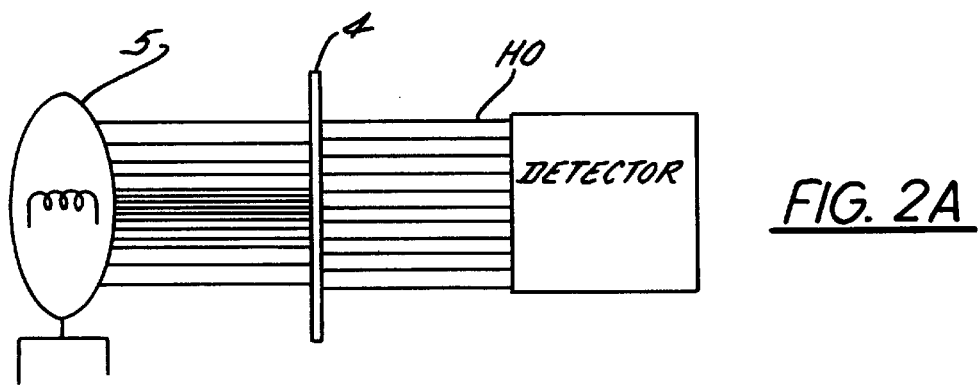
FIGS. 2A and B depict the homogenizer of the present invention destructuring light from a source.

In the case of a reflection homogenizer 2, a reflective coating such as aluminum is deposited on the surface of the homogenizer 2 to reflect light rays incident thereon in accordance with the sculpted surface structure. Light is not directed into areas where it is not desired and instead is redirected into the predefined output area increasing brightness in that entire area The homogenizers of the present invention may be employed in a multitude of applications. For instance, the homogenizer of the present invention has a significant use as a light source destructuring device. In many applications, it is desirable to eliminate from the output of the light source itself the structure of the filament which can be problematic in certain applications because light distributed across the sample will vary and this is undesirable. Also, variances in the orientation of a light source filament or arc after a light source is replaced can generate erroneous and misleading readings. A homogenizer 4 of the present invention placed between the light source 5 and the detector as seen in FIG. 2A can eliminate from the output of the light source any trace of the filament structure and therefore causes a homogenized output HO which is identical from light source to light source.

Figure 2B:
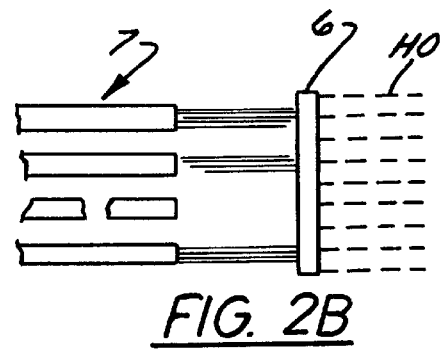

Fiberoptic light assemblies mounted on a surgeon's headpiece can cast distracting intensity variations on the surgical field if one of the fiberoptic elements breaks during surgery. As seen in FIG. 2B, homogenizer 6 of the present invention placed at the ends of the fiber bundle 7 homogenizes light coming from the remaining fibers and eliminates any trace of the broken fiber from the light cast on the patient. A standard ground glass diffuser would not be as effective in this use due to significant backscatter causing loss of throughput. In addition to homogenizing, the homogenizer of the present invention may contain a sculpted surface structure which not only homogenizes but directs light into a wide field of view particularly suitable for surgery. The homogenizer of the present invention may also be used in fiber optic endoscope applications whereby the homogenizer may be placed at the end of the endoscope optic to change the numerical aperture of the optic to match that of the camera which displays the images from the body.

Scientific instruments analyze different media, such as biologicals, organic and inorganic chemicals, by using methods such as emission and absorption, fluorescence and Raman. In these analyses, the wavelength of light, $\lambda_0$, from the sample is undesirable and should be kept away from the detector. The $\lambda_0$ wavelength is typically avoided by painting the inside of the device black to help absorb the light. This is insufficient, however, because paint usually fluoresces and is directional in its reflection and is never totally absorbent. A homogenizer of the present invention adhered to the walls of the detector area can redirect the $\lambda_0$ wavelength away from the detector by using an appropriate surface structure on the homogenizer. This type of "light trap" is also useful in devices such as spectrometers to redirect stray light The homogenizers of the present invention can also be used to homogeneously illuminate a sample under a microscope by destructuring the filament or arc of the source, yielding a homogeneously illuminated field of view. The homogenizer may also be used to homogenize the various modes that propagate through a fiber, for example, the light output from a helical-mode fiber.

Figure 3:
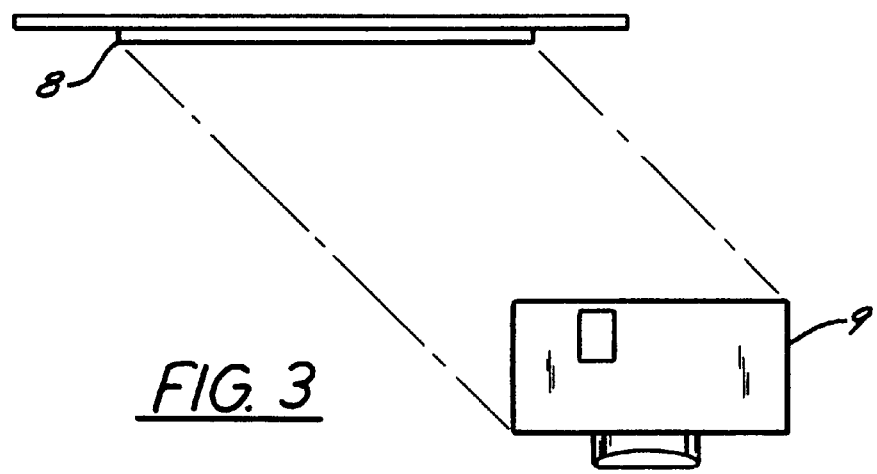
FIG. 3 depicts the homogenizer of the present invention providing directional lighting in the workplace.

The homogenizers of the present invention also have significant architectural uses such as providing appropriate light for work and living spaces. In typical commercial applications, inexpensive plastic sheets with a moulded macroscopic surface structure are used to help diffuse light over the room. A homogenizer of the present invention which replaces one of these conventional diffusers provides a more uniform light output so that light is diffused to all angles across the room evenly and with no hot spots. Furthermore, as seen in FIG. 3, the surface structure of the homogenizer 8 may be made to direct light to a certain portion of the room, such as a work area 9, where it is desired. This is done not by absorbing light before it can reach the areas that are not to be lit but by redirecting that light toward the areas desired to be lit.

Figure 4:
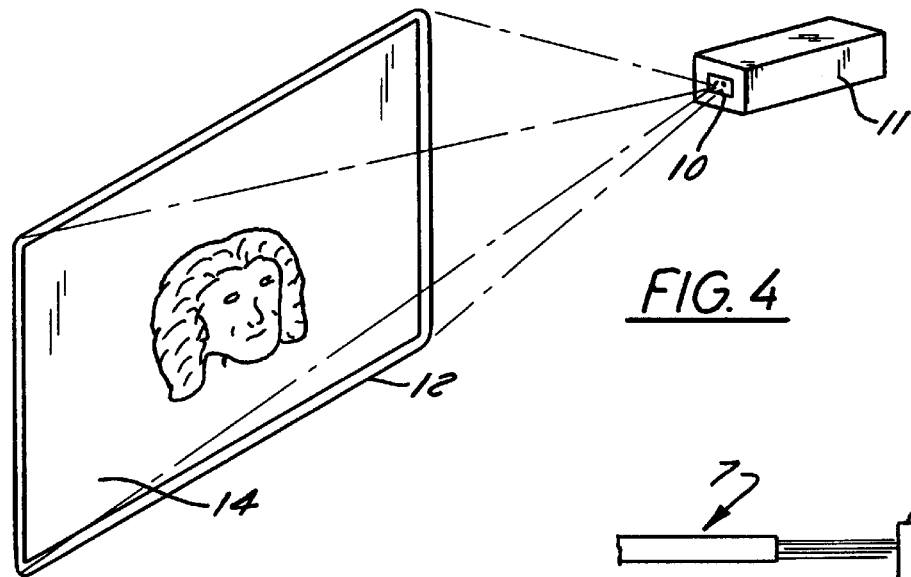
FIG. 4 depicts the homogenizer of the present invention shaping light incident a piece of art.

The homogenizers of the present invention may also be used to diffuse light illuminating artwork, as seen in FIG. 4. Homogenizer 10 on light source 11 provides a suitable appropriately sized and directed aperture 12 for depicting the artwork 14 in a most desirable fashion.

The homogenizers may also be used to control lighting for stages by providing pleasing homogenized light that is directed where desired. In stage and television productions, a wide variety of stage lights must be used to achieve all the different effects necessary for proper lighting. This requires that many different lamps be used which is inconvenient and expensive. The homogenizer of the present invention placed over a lamp can give almost unlimited flexibility dispersing light where it is needed. As a consequence, almost any object, moving or not, and of any shape, can be correctly illuminated.

The homogenizers of the present invention may also be used in the area of law enforcement and security systems to homogenize the output from laser diodes (LDs) or light emitting diodes (LEDs) over the entire secured area to provide higher contrasts to infrared (IR) detectors. The homogenizers of the present invention may also be used to remove structure from devices using LED or LD sources such as in bank note readers or skin treatment devices. This leads to greater accuracy.

The homogenizers of the present invention may also be used in liquid crystal display (LCD) display backlights where there is a fluorescent lamp behind the LCD material. The homogenizer may be placed in front of the LCD material in a transmission mode to disburse the light and make it much more homogenous. The homogenizer of the present invention may also be placed behind the fluorescent light source, in reflection, to homogenize the light coming toward the viewer.

The preferred methods for making the directional homogenizers of the present invention are now described. Generally, the first step is to create a master diffuser, the second step is to record in a photosensitive medium with coherent light passed through the master diffuser, and the third step is to replicate the surface structure of the photosensitive medium with, for example, epoxy. A fourth and optional step is to make a metal electroform master from the epoxy for mass production purposes. In the alternative, an electroform master may be made directly from the master diffuser.

Figure 5A:
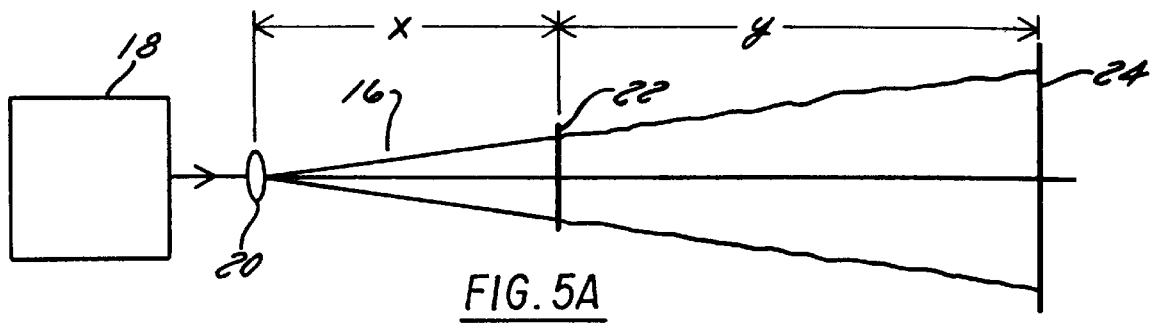
FIG. 5A is a recording set-up using an objective lens and a transmissive diffusing material used to record the photosensitive medium and FIG. 5B is a photograph of the surface of a 20° circular homogenizer magnified several hundred times.

Referring to FIG. 5A, a recording set-up 16 is shown comprising a coherent laser light source 18, objective lens 20, master diffuser 22, and photosensitive medium 24. Coherent laser light source 18 is standard. The objective lens 20 is standard and may be a low or high magnification lens depending upon the desired characteristics of the photosensitive medium 24. The objective lens is spaced a distance X from the master diffuser 22. The master diffuser 22 may comprise a standard ground glass diffuser, a lenticular diffuser, an acetate diffuser, or a holographic diffuser. The ground glass, lenticular, and acetate diffusers are conventional and made in a conventional manner. If a holographic master diffuser is desired to be used, that master diffuser may itself first be recorded in the recording set-up shown in FIG. 5A with the holographic master diffuser to be recorded being positioned at 24 and a conventional ground glass diffuser being located at 22. That master diffuser may then be used to record into another photosensitive medium to be used as a homogenizer of the present invention.

A related set-up for recording volume holographic diffusers is described in co-pending application Ser. No. 848,703 filed Mar. 9, 1992, now U.S. Pat. No. 5,366,354 having a common assignee, the essentials of which are incorporated herein by reference. According to that disclosure, recording a holographic plate with coherent laser light passed through a conventional ground glass diffuser generates features called speckle in the volume of the hologram. This speckle is random, disordered and non-planar speckle that defines non-discontinuous and smoothly varying changes in the refractive index of the medium which scatter collimated light into a controlled pattern with smooth brightness variation. The size, shape, and orientation of the speckle can be adjusted which in turn affects the angular spread of light scattered from the holographic diffuser upon playback. Generally, the size of the angular spread of the scattered light, in other words, the angular distribution of the scattered light, depends on the average size and shape of the speckle. If the speckle are small, angular distribution will be broad. If the speckle size is horizontally elliptical, the shape of the angular distribution will be vertically elliptical. Thus, it is desirable to control the size and shape of speckle recorded in the medium so that, upon playback, the correct output or angular spread is produced.

Speckle size is inversely proportional to the size of the aperture of the master diffuser. If the size of the aperture increases, the size of the speckle decreases and the size of the angular spread of the scattered light from the recorded photosensitive medium increases. Conversely, if the size of the master diffuser aperture decreases, the size of the speckle recorded in the diffuser increases and the angular spread of light scattered from the recorded photosensitive medium decreases. Thus, if the master diffuser aperture is long and narrow, the speckle will be long and narrow as well with their axes oriented perpendicularly to the axis of the aperture. This holds true for both volume holographic recording media as well as surface holographic recording media.

Diffusers made from volume holographic recording media as in Ser. No. 848,703, however, are disclosed there for their volume effect. In other words, the speckle recorded in the interior or volume of the medium was thought the only desired effect to be obtained from the material. However, since then we have discovered that recording a volume holographic angular spread such as DCG (dichromated gelatin) in a similar recording set-up produces a surface effect of peaks and valleys which may be replicated as described below.

The size, shape, and orientation of the surface features recorded in photosensitive medium 24 is a function of a number of variables including the type of objective lens 20 and master diffuser 22 used, as well as the relative positioning of those components with respect to each other and with respect to the photosensitive medium 24. Ultimately, the desired results are obtained through empirical testing. In order to achieve a recorded photosensitive medium having a particular surface structure that can be replicated and comprise a homogenizer of the present invention, it may be necessary to adjust the parameters discussed below to achieve the desired shape of the light output.

The objective lens 20 expands the coherent laser light source 18 so that the area of incidence (or "apparent aperture") of light from the objective lens 20 on the master diffuser 22 is larger than that of the cross section of the laser beam itself. The light beam expands in accordance with the magnification of the objective lens 20.

Consequently, if a small magnification objective lens is used, such as 5X, the aperture of light incident the master diffuser 22 will be smaller than with a large magnification objective lens, such as 60X or greater, and therefore the size of the surface features recorded in the photosensitive medium 24 will be larger; the size of the aperture of light incident the master diffuser 22 is inversely related to the size of the surface features recorded in the photosensitive medium 24.

The distance between the objective lens 20 and the master diffuser 22 must also be taken into account in achieving the desired sculpted surface structure recorded in the photosensitive medium 24. As the distance between the objective lens 20 and the master diffuser 22 decreases, i.e., as X decreases, the size of the speckle increases. This occurs because as the objective lens 20 moves closer to the master diffuser 22, the apparent aperture of light incident the master diffuser 22 is smaller. Because the size of the speckle recorded in the photosensitive medium 24 is inversely related to the size of the apparent aperture on the master diffuser 22, the speckle will be larger. In turn, the increased speckle size recorded in the photosensitive medium 24 will result in a homogenizer which has decreased diffusion.

Conversely, if the distance X is increased, the apparent aperture of light incident the master diffuser 22 will increase, thus decreasing the size of the speckle recorded in the photosensitive medium 24 and in turn increasing the amount of angular spread of the homogenizer.

The distance Y between the master diffuser 22 and the photosensitive medium 24 also affects speckle size. As the distance Y decreases, the size of the speckle recorded in the photosensitive medium 24 decreases as well. This occurs because, assuming an expanded beam of light is produced at objective lens 20, as the photosensitive medium 24 is moved closer to the master diffuser 22, the light beam emanating from each of the irregularities in the master diffuser 22 will expand less by the time it reaches the photosensitive medium 24, thus producing smaller speckle. Conversely, if the distance Y is increased, the size of the speckle recorded will be increased. Thus, these simple relationships between the distances X, Y, and the magnification of the objective lens 20, are all adjusted, empirically, to achieve the size of speckle desired in the photosensitive medium 24.

Predefined output areas that are "off-axis" with respect to the normal axis of the diffuser are achieved by tilting the photosensitive medium 24 around an axis normal to its surface. For example, a 20° off axis diffuser may be achieved by fitting the photosensitive medium 24 roughly 20°.

Figure 5B:
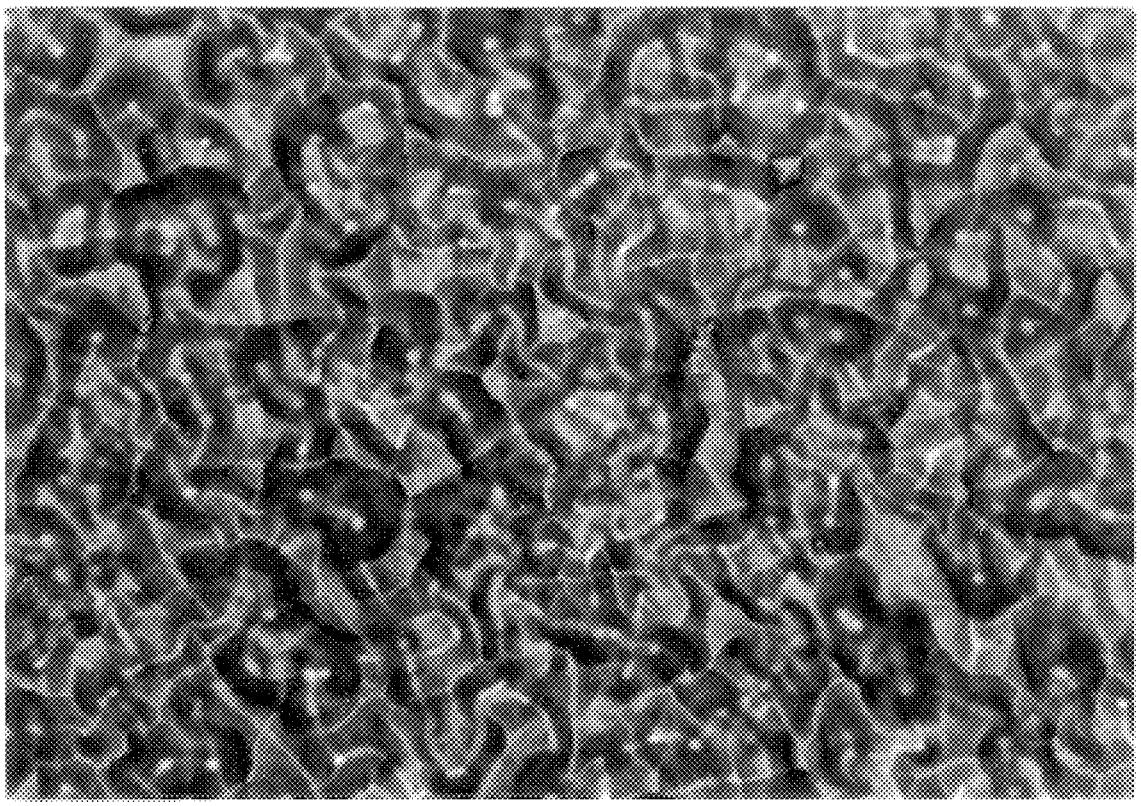

Assuming that a ground glass diffuser is used as the master diffuser 22, the shape of the speckle recorded in photosensitive medium 24 will be roughly round as will the shape of the angular output of a homogenizer made from photosensitive medium 24. FIG. 5B is a photograph of the surface of a homogenizer having a round angular output. A round output may also be achieved when a lenticular or an acetate sheet is used as a master diffuser 22. Lenticular sheets have tiny lens-like elements machined in them. Acetate diffusers are made by an extrusion and embossing process which also yields roughly round speckle. It is difficult to create or control the desired irregularities in acetate diffusers. With respect to lenticular diffusers, the surface effects necessary to achieve varying output shapes are complex machined macroscopic structures. If a prerecorded holographic master diffuser is used as the master diffuser 22, additional degrees of recording freedom are achieved because the master diffuser can be prerecorded with speckle having virtually any shape, size, and orientation as discussed further below. Speckle characteristics are more easily controlled using a holographic master diffuser.

In any case, in the recording set-up in FIG. 5A, the master diffuser must be able to transmit light so that it reaches the photosensitive medium 24 from the objective lens 20. Thus, if a substrate is needed as part of the master diffuser 22, such as if a holographic master diffuser is used, the substrate should be capable of efficiently transmitting light. A glass substrate is preferable. In addition to the additional degrees of freedom which can be achieved by using a prerecorded volume or surface hologram as the master diffuser 22, holographic master diffusers are preferable because better uniformity of intensity in the photosensitive medium 24 is achieved, higher transmission efficiency through the master diffuser 22 is achieved, and the holographic master diffuser 22 causes less back scatter than a ground glass diffuser. A first generation holographic volume master diffuser may be made using a ground glass or acetate diffuser. This holographic diffuser can then be used to make a second generation holographic master diffuser, either volume or surface with greater control.

Figure 6:
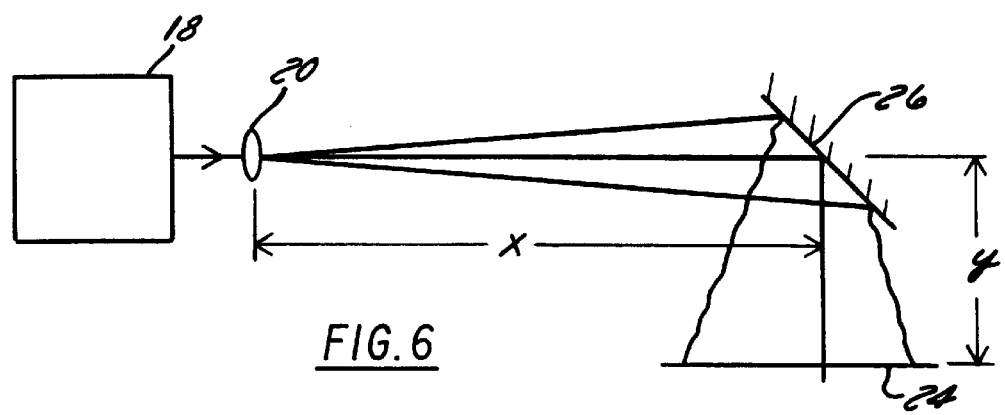
FIG. 6 is a recording set-up using an objective lens and a reflective diffusing material to record the photosensitive medium.

Referring now to FIG. 6, a reflection recording set-up for recording in a photosensitive medium 24 is depicted. Coherent laser light from light source 18 is incident the objective lens 20 which collimates and expands the light which is then incident upon reflective master diffuser 26 situated distance X from the objective lens 20. The light reflected from the reflective master diffuser 26 is then incident upon the photosensitive medium 24. The coherent laser light source 18, objective lens 20, and photosensitive medium 24 retain the same numerals as in FIG. 5A because they are the same elements. As in FIG. 5A, ground glass, lenticular, acetate, or volume holographic master diffusers may be used but with the addition of a suitably front reflective surface so that light is not transmitted through master diffuser 26 but is reflected therefrom onto the photosensitive medium 24. Variations in the distance X, distance Y, and the magnification of the objective lens 20 have the same effect as described above with respect to the recording set-up in FIG. 5A.

The distinction between the homogenizer of the present invention and conventional diffusers is highlighted further when one considers the ability to record surface features in the angular spread which are not only round and produce round outputs as is conventionally found in ground glass, acetate, and lenticular diffusers, but which produce surface features, and therefore angular outputs, of any number of shapes not possible before, including off-axis outputs.

Figure 7:
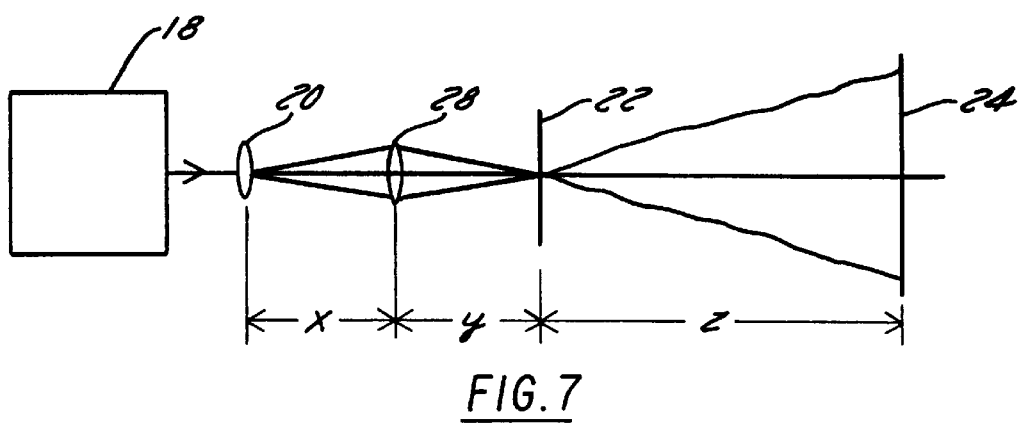
FIG. 7 is a recording set-up using two lenses and a transmissive diffusing material to record the photosensitive medium.
Figure 8A:
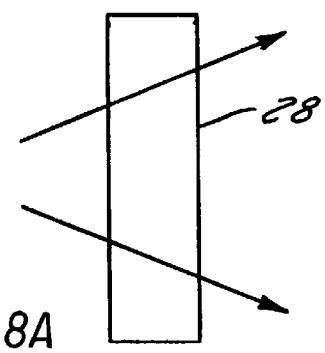
FIGS. 8A and B are schematics of light passing through a cylindrical lens.
Figure 8B:
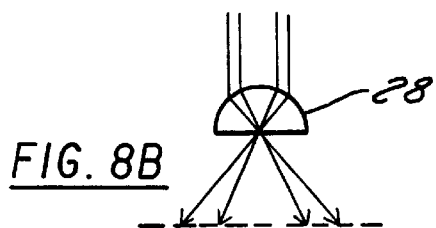

Referring now to FIG. 7, a recording set-up using an additional lens 28 with the coherent laser light source 18, objective lens 20, master diffuser 22, and photosensitive medium 24 is depicted in a transmission recording set-up. As can be appreciated, many different types of lenses can be used to shape the light beam from the coherent laser light source 18 before it reaches the master diffuser 22. Because one of the primary objectives of the present invention is to achieve the desired sculpted surface structure in photosensitive medium 24 which will yield the desired angular spread, additional lens 28, which is positioned between the objective lens 20 and the master diffuser 22, may be chosen to produce the desired shape and orientation. In this case, additional lens 28 is a cylindrical lens which outputs diverging light rays in one direction as shown in FIG. 8A and light rays that converge to a line in another direction as shown in FIG. 8B. Thus, the light rays that are incident the master diffuser 22 in FIG. 7 are diverging with respect to each other in one direction and converging upon each other into a line in the perpendicular direction. Therefore, light rays passing through and exiting the master diffuser 22 are likewise diverging more rapidly in a direction perpendicular to the line of light on the master diffuser than are the light rays that are parallel to that line.

Figure 9A:
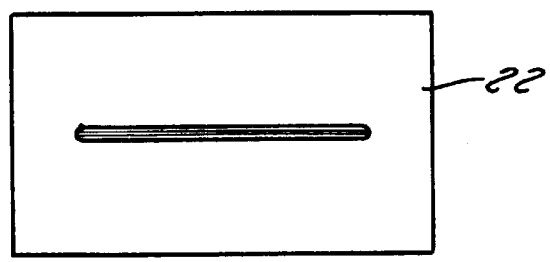
FIG. 9A depicts light incident on a master diffuser from a cylindrical lens.
Figure 9C:
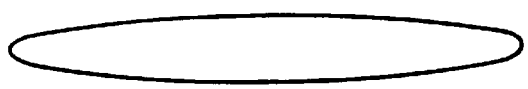
FIG. 9C depicts the angular output of a homogenizer of the present invention.
Figure 9E:
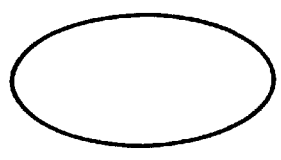
FIG. 9E depicts the angular output of a homogenizer of the present invention.
Figure 9B:
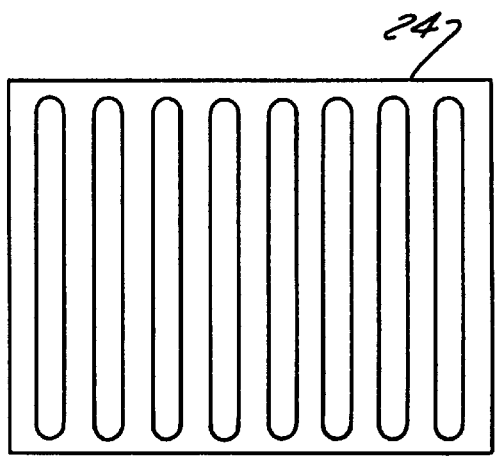
FIG. 9B depicts speckle recorded in a photosensitive medium using a cylindrical lens.
Figure 9D:
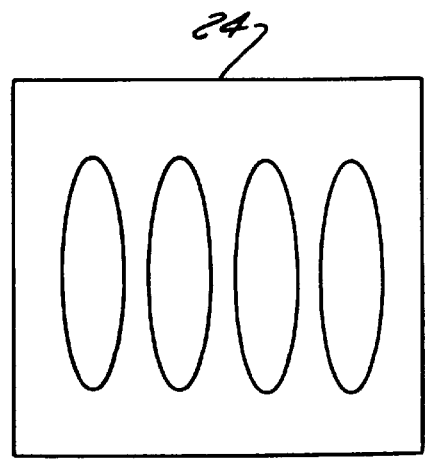
FIG. 9D depicts speckle recorded in a photosensitive medium.
Figure 9F:
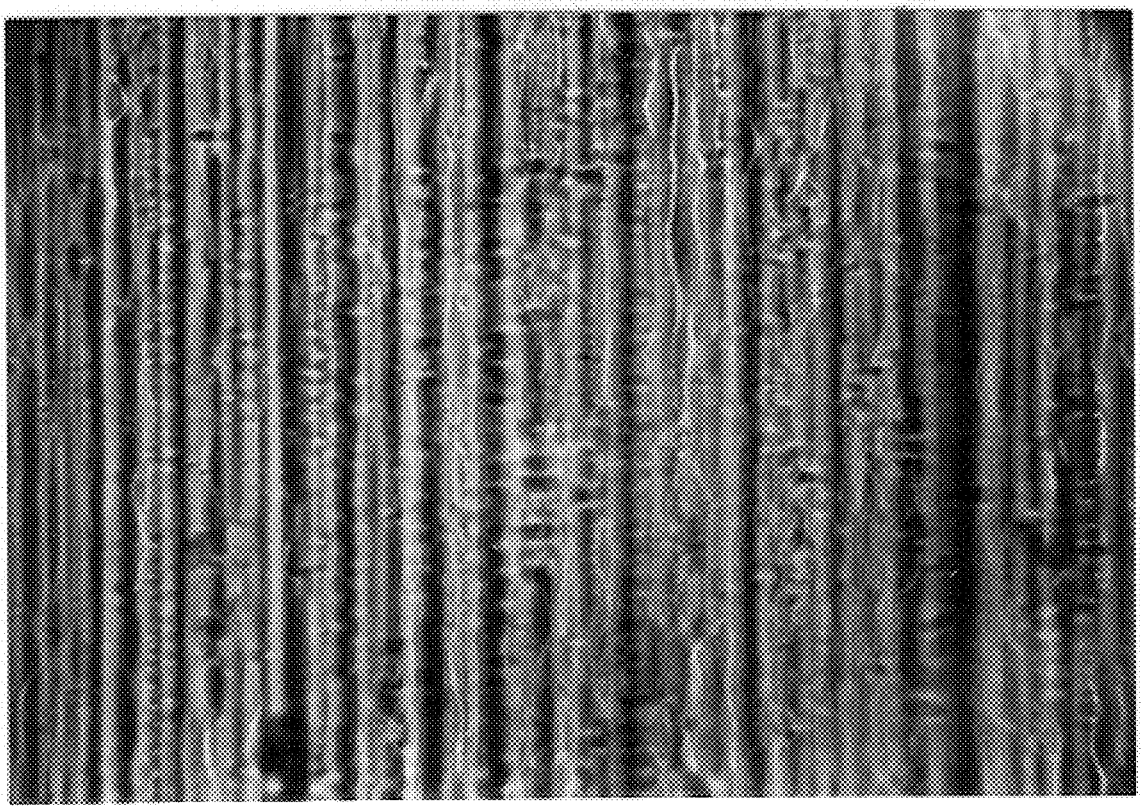
FIG. 9F is a photograph of the surface of a homogenizer of the present invention.

In the recording set-up of FIG. 7, the master diffuser may preferably be near or at the focal point of the cylindrical lens 28. If the master diffuser 22 is at the focal point of the cylindrical lens 28, the maximum effect from the cylindrical lens will be achieved. That effect can be likened to stretching the speckle which are recorded in the photosensitive medium 24 in one direction. As a result, the speckle recorded in photosensitive medium 24 in the recording set-up in FIG. 7 will be long in one direction and short in the perpendicular direction taking on roughly the shape of the "line" shaped light beams produced by cylindrical lens 28, but oriented at 90° thereto. FIG. 9A shows the light incident on the master diffuser 22 from the cylindrical lens 28, which is aligned in a horizontal direction. The speckle recorded in the photosensitive medium 24 will have an orientation 90° to this horizontal line as seen in FIG. 9B and produce a narrow, long angular output as shown in FIG. 9C. If the master diffuser 22 is at the focal point of the cylindrical lens 28, the degree of stretch of the speckle shown in FIG. 9B will be at its maximum. If the master diffuser 22 is placed on either side of the focal point of the lens 28, the speckle will tend to be shorter in the vertical direction and wider in the horizontal direction as seen in FIG. 9D and produce a slightly wider, shorter angular output as shown in FIG. 9E. FIG. 9F is a photograph of the surface of such a homogenizer magnified several hundred times. The elongated surface features, which appear as peaks and valleys, are visible.

As also seen in FIG. 7, the objective lens 20 and cylindrical lens 28 are separated by the distance X, the cylindrical lens 28 and the master diffuser 22 are separated by the distance Y, and the master diffuser 22 and the photosensitive medium 24 are separated by the distance Z. As in the above recording set-ups, if X is increased, the size of the speckle decreases. If Z is increased, the size of the speckle increases. If Y equals the focal length of the cylindrical lens, which is the smallest aperture, the speckle will be larger than if the master diffuser 22 is off the focal length in either direction.

Figure 10:
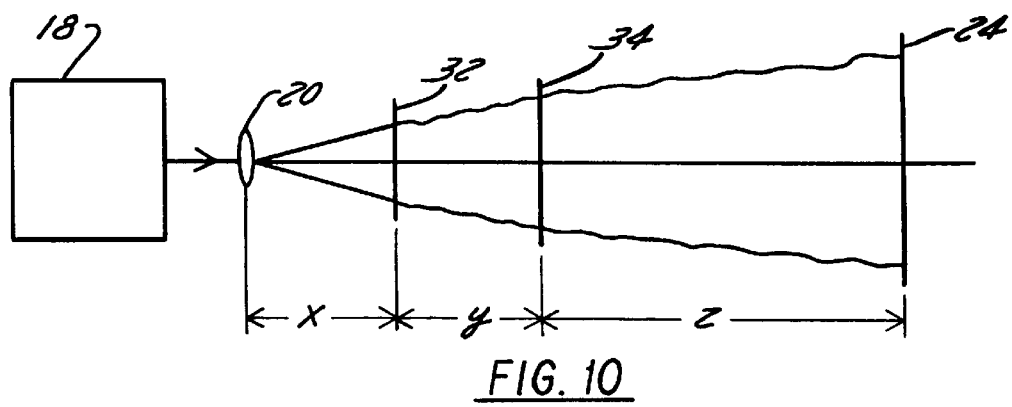
FIG. 10 is a recording set-up using an objective lens and two holographic diffusers to record the photosensitive medium.

The photosensitive medium 24 recorded with the vertically oriented line-like speckles in the recording set-up of FIG. 7 can then be replicated as described below and used as a directional homogenizer of the present invention, or may itself be used as a master diffuser in another recording set-up to achieve additional degrees of freedom as is seen in FIG. 10. If the recorded photosensitive medium is used as a master diffuser for subsequent recordings, it may be unnecessary to use lens 28 because the master diffuser will create the desired elliptical speckle in the photosensitive medium 24.

Referring now to FIG. 10, there is depicted a coherent laser light source 18, objective lens 20, and a photosensitive medium 24 similar to those in the previous drawings. Also depicted is a first master diffuser 32 and a second master diffuser 34. The recording set-up in FIG. 10 is preferred where the least amount of back scatter, the greatest amount of transmission efficiency, and the greatest uniformity of intensity is desired. By using two master diffusers prerecorded with, for example, elliptical speckle oriented in the same direction in both master diffusers 32 and 34, elliptical speckle are generated in the photosensitive medium 24 which have better intensity than can be recorded with one master diffuser. Furthermore, recording media of larger surface area are made possible by using two master diffusers. Finally, a cylindrical lens need not be used.

Figure 11A:
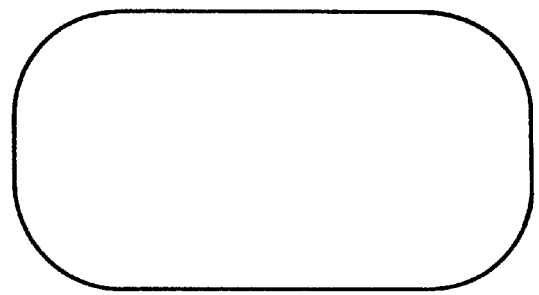
FIGS. 11A and B depict the angular output of a homogenizer of the present invention recorded sequentially with elongated elliptical speckle in one direction and elongated elliptical speckle in a perpendicular direction.
Figure 11B:
FIG. 11C is a photograph of the surface of a homogenizer of the present invention depicting the output of such a homogenizer, FIGS. 12A–E compare the FWHM (full width half maximum) of a 20° homogenizer of the present invention (12A), a 10° homogenizer of the present invention (12B), with a 20 micron ground glass diffuser (12C), an acetate diffuser (12D), and a lenticular diffuser (12E).
Figure 11C:
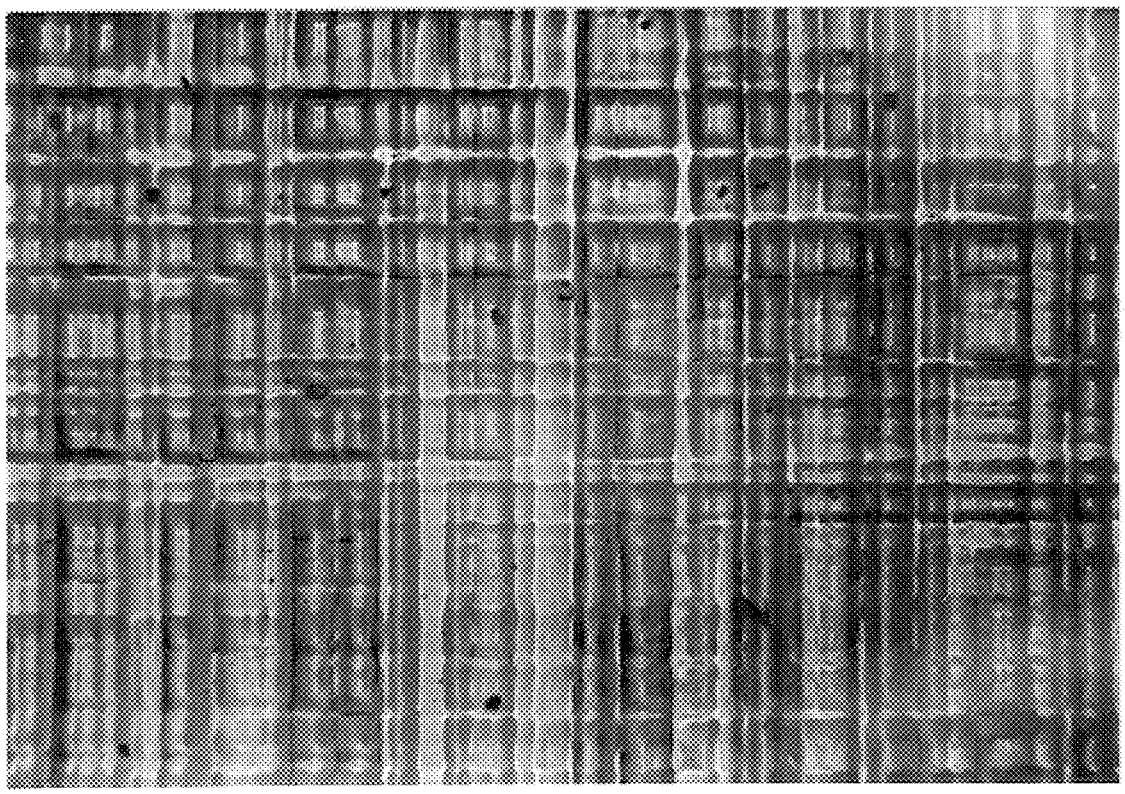

The output in FIG. 11A is rectangular and produced by recording in the same photosensitive medium elongated elliptical speckle in the horizontal direction and elongated elliptical speckle of a slightly lesser degree in the vertical direction. These two recordings may be accomplished sequentially using either volume holographic master diffusers prerecorded with elliptical speckle or a cylindrical lens and a conventional round output diffuser, or other combinations of lens and master diffusers. FIG. 11B shows an output having roughly the same full width half maximum (FWHM) in the horizontal direction as in FIG. 11A but an FWHM in the vertical direction reduced by roughly a factor of 2. Angular output was measured at FWHM which is a measurement of angular spread of the output from the homogenizer at all peripheral points which are at one-half the intensity of light passing through the center of the directional homogenizer. The sculpted surface features of the homogenizer having the output shown in FIG. 11A is best described by two perpendicular, intersecting sets of peaks and valleys in the surface as seen in the photograph in FIG. 11C.

Figure 12A:
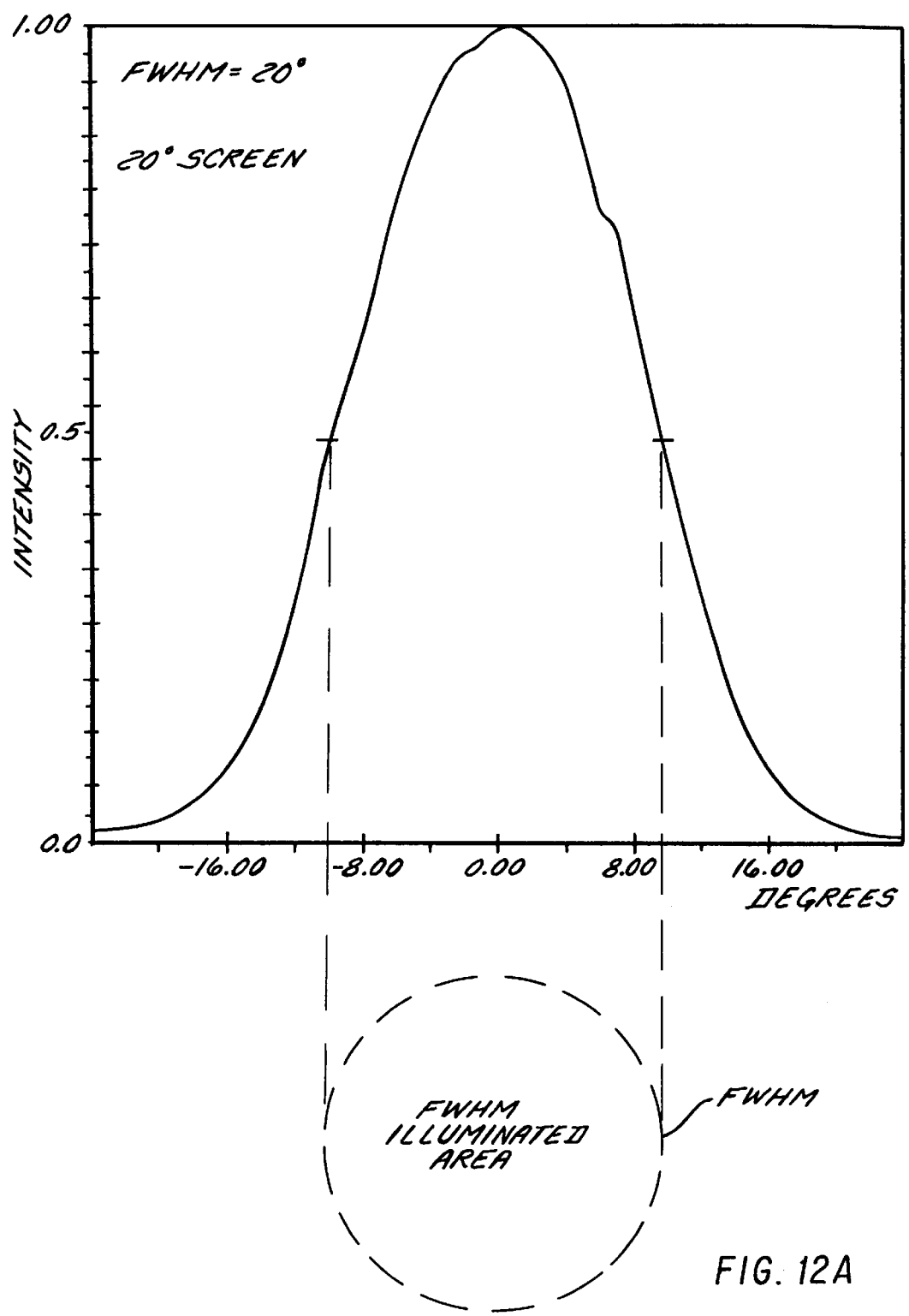

The high efficiency of the homogenizers of the present invention is highlighted by FIGS. 12A–E. Shown in FIG. 12A is a plot of power or light intensity through a directional homogenizer versus the angular spread of light output from the directional homogenizer in degrees. The homogenizer of the present invention which produced the output shown in FIG. 12A is a 20° circular homogenizer. In other words, this homogenizer has an FWHM of approximately 20° (19.55 actual). As can be seen from FIG. 12A, side lobe (the area outside the predefined output area or FWHM illuminated area) intensity is minimal, thus conserving light energy.

Figure 12B:
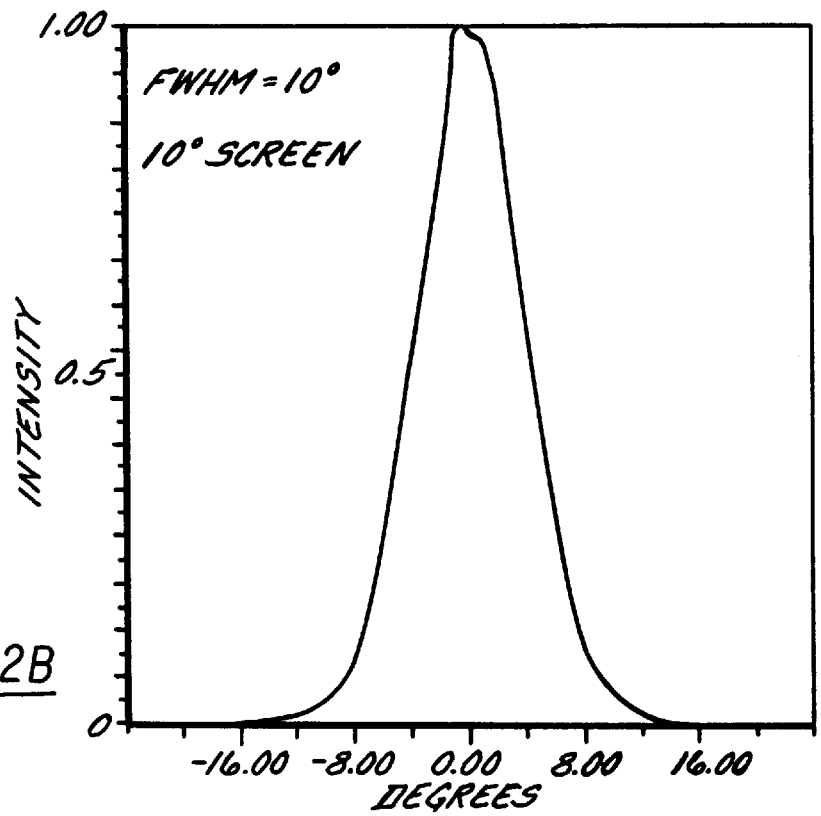

Referring now to FIG. 12B a homogenizer having a FWHM of 10° is depicted. The minimal side lobes are especially apparent here where intensity drops virtually to zero at about 12° from center. This homogenizer, as opposed to the homogenizer which produced the output of FIG. 12A produces a very narrow circular spot of light. It can be appreciated that homogenizers of an unlimited number of FWHM values may be produced in accordance with the present invention, thus making possible homogenizers having a myriad of output shapes and intensities suitable for virtually any application.

Figure 12C:
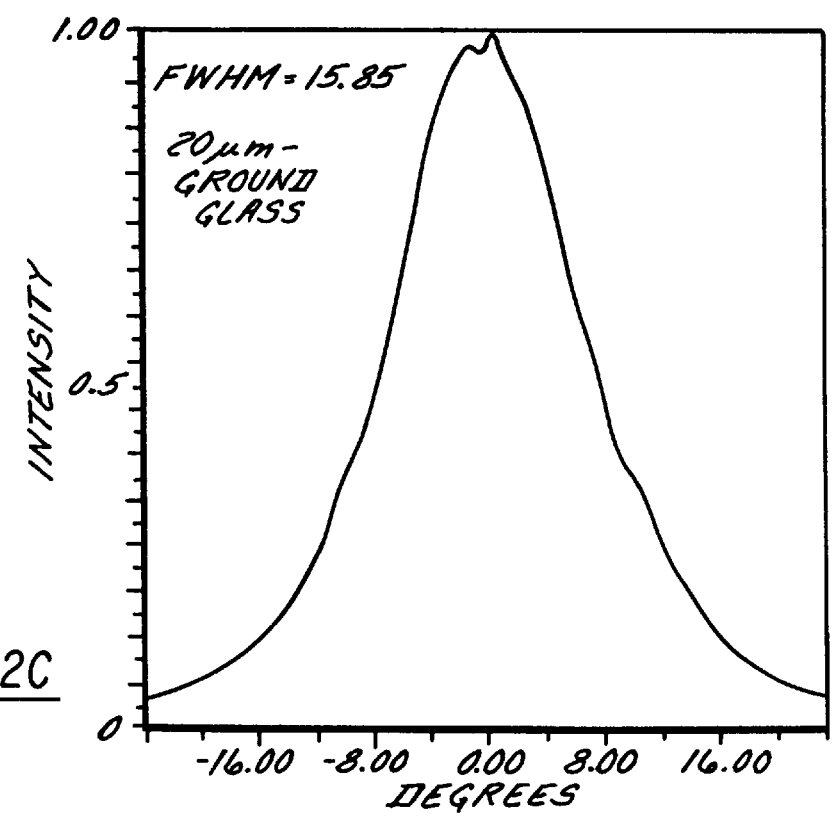
Figure 12D:
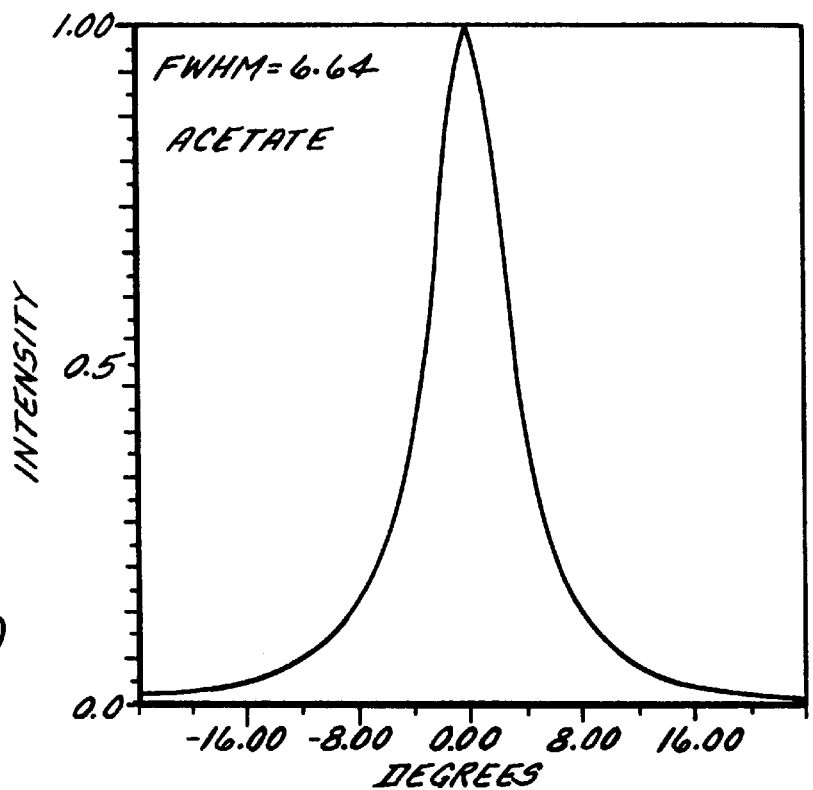
Figure 12E:
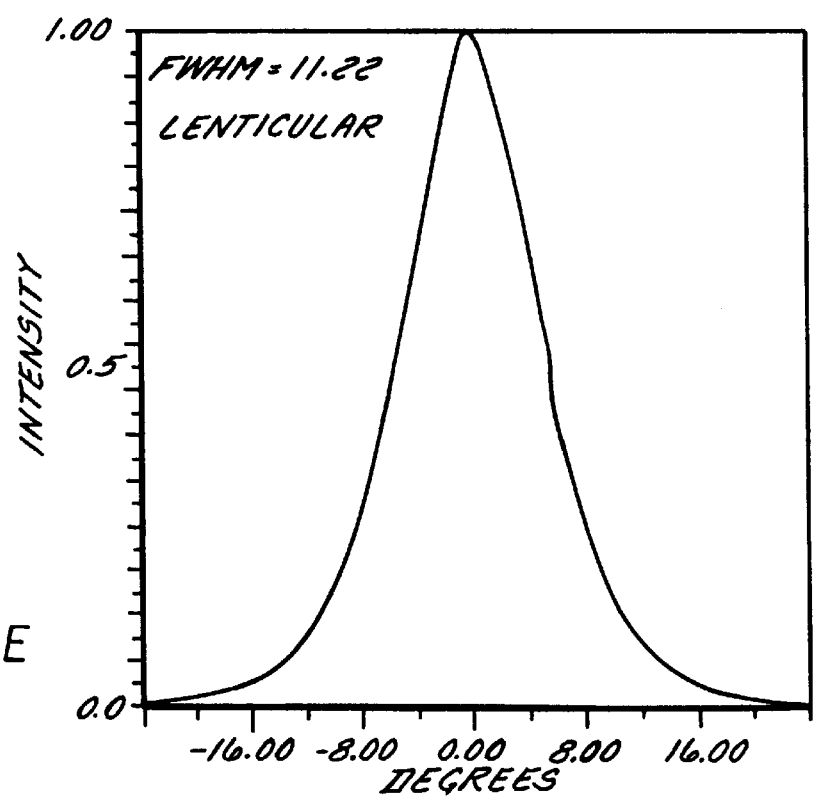

FIGS. 12C, D, and E respectively show, for comparison purposes, the output from a 20 micron ground glass diffuser, an acetate diffuser, and a lenticular diffuser. It is apparent that the side lobes in each of FIGS. 12C–E are large which means that energy is wasted. Furthermore, it can be appreciated that because of the manner in which ground glass, acetate, and lenticular diffusers are produced, there is far less ability to control irregularities in these diffusers and the exact output characteristics desired. The present invention is a significant advance because it is easy to create and control the speckle in the homogenizer to achieve the desired homogenized pattern.

After recording, conventional development processes are used to develop the photosensitive medium. In the case of DCG, water-alcohol baths are used to swell the non-exposed areas to a greater degree than the exposed areas to create the surface structure. If photoresist is used, the exposed areas are removed and the unexposed areas remain intact when developed.

Once the photosensitive medium 24 is recorded and developed with the desired features using any of the above recording set-ups or equivalent ones, the photosensitive medium is processed as follows. The surface structure of the photosensitive medium 24 may preferably be rendered into a standard curable epoxy or silicone rubber or other molding agent. A release agent is preferably applied to the photosensitive medium prior to application of the epoxy to facilitate removal of the epoxy after curing. It is preferable to evaporate a release layer on the angular spread such as oil or another suitable "slippery" release agent The epoxy may be applied to the photosensitive medium and then a substrate, such as glass, metal, or plastic, placed on top of the epoxy to sandwich it between the photosensitive medium and the substrate. Alternatively, the epoxy may first be applied to a substrate which has been roughened somewhat to ensure that the epoxy sticks to it and then the epoxy sandwiched between the photosensitive medium and the substrate.

It is necessary to ensure that the epoxy is uniformly sandwiched between the photosensitive medium 24 and the substrate so that no air bubbles are present. After the sandwich is completed, the epoxy is then cured under a UV lamp, or cured after a passage of time if it is time curing epoxy, and finally the epoxy is separated from the photosensitive medium. If the photosensitive medium is DCG, additional epoxy replicas of it may be made, called "parent" replicas.

Standard mass production techniques can be used to create large numbers of exact copies of the parent (epoxy) replicas. Typically, the parent replicas may be subjected to conventional electroform processes, such as nickel electroform, to create a metal master which may then be used to emboss polyester or any thermoformable plastic. The type of reproduction used of course depends upon the number of copies desired and their ultimate use.

In larger homogenizers, it is obviously preferable to make the surface area of the photosensitive medium 24 as large as possible. In such a case, a nickel electroform master may be used to emboss a plurality of thermoformable plastic sheets which are then joined together to form a larger surface.

Embodiments of the present invention not disclosed herein are fully intended to be within the scope of the appended claims.

We claim:

1. A liquid crystal display system having a homogenizer spaced from a light source, the homogenizer made by a process including:
    A. generating random disordered non-planar speckle in a photosensitive medium having a refractive index by exposing said photosensitive medium with coherent light, said coherent light having been diffused through a diffuser, so as to define non-discontinuous and smoothly varying changes in said refractive index of said photosensitive medium, said non-discontinuous and smoothly varying changes scattering collimated light into a controlled pattern with smooth brightness variation;
    B. developing said photosensitive medium to form a micro-sculpted surface structure that (i) controls the direction in which light propagates and (ii) homogenizes light with directionality; and
    C. making a replica of said micro-sculpted surface structure from said photosensitive medium,
    wherein light scattered from said replica of said micro-sculpted surface structure is characterized by said random, disordered and non-planar speckle.

2. The liquid crystal display system as defined in claim 1, wherein said diffuser is a master holographic diffuser.

3. The liquid crystal display system as defined in claim 1, wherein said process further includes:
    placing a release agent on said micro-sculpted surface structure so as to form a release coating; and
    making said replica by coating a substrate with an epoxy, placing said epoxy against said release coating, curing said epoxy, and separating said epoxy from said release coating.

4. The liquid crystal display system as defined in claim 3, wherein said substrate is selected from the group consisting of a glass substrate, a plastic substrate and a metal substrate.

5. The liquid crystal display system as defined in claim 3, wherein said process further includes making a metal master from said replica using an electroform process.

6. The liquid crystal display system as defined in claim 3, wherein said process further includes:
    producing said homogenizer from said metal master by thermoplastic embossing a thermoplastic material with said metal master.

7. A method of displaying data which utilizes the apparatus of claim 1.

8. A liquid crystal display system having a homogenizer with a normal axis, a horizontal direction, and a vertical direction, said homogenizer spaced from a light source and including:
    A. a sheet of deformable material having formed therein a micro-sculpted surface structure that (i) controls the direction in which light propagates and (ii) homogenizes light with directionality, said micro-sculpted surface structure having been formed by replicating in said sheet of deformable material a prior micro-sculpted surface structure that (i) controls the direction in which light propagates and (ii) homogenizes light with directionality, said prior micro-sculpted surface structure having been formed in a photosensitive medium having a refractive index by:
        (a) generating random, disordered and non-planar speckle in said photosensitive medium using coherent light, said coherent light having been diffused through a diffuser, so as to define non-discontinuous and smoothly varying changes in said refractive index of said photosensitive medium, said non-discontinuous and smoothly varying changes scattering collimated light into a controlled pattern with smooth brightness variation; and
        (b) developing said photosensitive medium; and
    B. a reflective layer deposited on and conforming to said micro-sculpted surface structure, whereby light incident on said homogenizer is reflected into an output area by said micro-sculpted surface structure,
    wherein light scattered from said micro-sculpted surface structure is characterized by said random, disordered and non-planar speckle.

9. The liquid crystal display system as defined in claim 8, wherein said output area has an output area normal axis which is off the normal axis of said homogenizer.

10. The liquid crystal display system as defined in claim 8, wherein said micro-sculpted surface structure is made by recording said prior micro-sculpted surface structure in said photosensitive medium, making a replica of said prior micro-sculpted surface structure from said photosensitive medium, making a metal master of said replica from said replica, and embossing said sheet of deformable material with said metal master.

11. The liquid crystal display system as defined in claim 8, wherein said photosensitive medium includes dichromated gelatin.

12. The liquid crystal display system as defined in claim 8, wherein said diffuser is a master holographic diffuser.

13. A light emitting diode system having a homogenizer spaced from a light source, the homogenizer made by a process including:
    A. generating random disordered non-planar speckle in a photosensitive medium having a refractive index by exposing said photosensitive medium with coherent light, said coherent light having been diffused through a holographic diffuser, so as to define non-discontinuous and smoothly varying changes in said refractive index of said photosensitive medium, said non-discontinuous and smoothly varying changes scattering collimated light into a controlled pattern with smooth brightness variation;
    B. developing said photosensitive medium to form a micro-sculpted surface structure that (i) controls the direction in which light propagates and (ii) homogenizes light with directionality; and
    C. making a replica of said micro-sculpted surface structure from said photosensitive medium,
    wherein light scattered from said replica of said micro-sculpted surface structure is characterized by said random, disordered and non-planar speckle.

14. The light emitting diode system as defined in claim 13, wherein said micro-sculpted surface relief structure is characterized by peaks and valleys in a surface of said homogenizer so as to yield an output that is selected from the group consisting of circular, elliptical, and rectangular.

15. The light emitting diode system as defined in claim 13, wherein said output area is elliptical and said peaks and valleys are substantially straight and of random length.

16. The light emitting diode system as defined in claim 13, wherein said output area is rectangular and said micro-sculpted surface relief structure includes two intersecting sets of peaks and valleys.

17. The light emitting diode system as defined in claim 13, having an output intensity which is constant over a field of view.

18. A liquid crystal display comprising:

a display screen;

a light source disposed behind the display screen for illuminating the display screen; and a homogenizer spaced from the light source;

wherein the homogenizer includes a sheet of deformable material having formed therein a micro-sculpted surface structure that both controls the direction in which light propagates and homogenizes light with directionality, the homogenizer having been formed by generating random, disordered and non-planar speckle in a photosensitive medium using coherent light, the coherent light having been diffused through a diffuser, so as to define non-discontinuous and smoothly varying changes in a refractive index of the photosensitive medium, such that the non-discontinuous and smoothly varying changes scatter collimated light into a controlled pattern with a smooth brightness variation and then developing the photosensitive medium, wherein light scattered from the micro-sculpted surface structure is characterized by the random, disordered and non-planar speckle.

19. The liquid crystal display according to claim 18, wherein the homogenizer is disposed between the light source and the display screen and wherein the homogenizer transmits light through the homogenizer to the display screen.

20. The liquid crystal display according to claim 18, wherein the light source is disposed between the display screen and the homogenizer and wherein the homogenizer further comprises a reflective layer deposited on and conforming to the micro-sculpted surface structure, whereby light incident on the homogenizer is reflected into the display screen.

21. The liquid crystal display according to claim 20, wherein the diffuser is a master holographic diffuser.

22. A light emitting diode comprising:

a display surface;

a light source disposed behind the display surface for providing light thereto; and a homogenizer, spaced from the light source;

wherein the homogenizer includes a sheet of deformable material having formed therein a micro-sculpted surface structure that both controls the direction in which light propagates and homogenizes light with directionality, the homogenizer having been formed by generating random, disordered and non-planar speckle in a photosensitive medium using coherent light, the coherent light having been diffused through a diffuser, so as to define non-discontinuous and smoothly varying changes in a refractive index of the photosensitive medium, such that the non-discontinuous and smoothly varying changes scatter collimated light into a controlled pattern with a smooth brightness variation, and then developing the photosensitive medium, wherein the light scattered from the micro-sculpted surface structure is characterized by the random, disordered and non-planar speckle.

23. The light emitting diode according to claim 22, wherein the homogenizer is disposed between the light source and the display screen and wherein the homogenizer transmits light through the homogenizer to the display screen.

24. The light emitting diode according to claim 22, wherein the light source is disposed between the display screen and the homogenizer and wherein the homogenizer further comprises a reflective layer deposited on and conforming to the micro-sculpted surface structure, whereby light incident on the homogenizer is reflected into the display screen.

25. The light emitting diode according to claim 22, wherein the diffuser is a master holographic diffuser.

* * * * *